United States Patent
Lin et al.

(10) Patent No.: US 8,357,972 B2
(45) Date of Patent: Jan. 22, 2013

(54) SEMICONDUCTOR POWER DEVICE

(75) Inventors: Yung-Fa Lin, Hsinchu (TW); Shou-Yi Hsu, Hsinchu (TW); Meng-Wei Wu, Hsinchu (TW); Main-Gwo Chen, Hsinchu (TW); Yi-Chun Shih, Nantou County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 22 days.

(21) Appl. No.: 13/227,472

(22) Filed: Sep. 7, 2011

(65) Prior Publication Data

US 2012/0306006 A1    Dec. 6, 2012

(30) Foreign Application Priority Data

Jun. 2, 2011  (TW) .............................. 100119364 A

(51) Int. Cl.
*H01L 29/66* (2006.01)
(52) U.S. Cl. ........ 257/330; 257/302; 257/329; 257/331; 257/332; 257/335; 257/341; 257/397; 257/401; 257/513; 257/520; 257/586; 257/E21.41; 257/E21.262; 257/E29.256; 257/E29.262
(58) Field of Classification Search .................. 257/302, 257/329–332, 335, 341, 397, 401, 513, 520, 257/586, E21.41, E29.262, E29.256; 438/270
See application file for complete search history.

(56) References Cited

U.S. PATENT DOCUMENTS

| | | | |
|---|---|---|---|
| 6,396,090 B1 * | 5/2002 | Hsu et al. | 257/242 |
| 6,998,315 B2 * | 2/2006 | Hsieh et al. | 438/270 |
| 2010/0123198 A1 * | 5/2010 | Kim et al. | 257/377 |
| 2011/0084334 A1 * | 4/2011 | Lin et al. | 257/331 |

* cited by examiner

*Primary Examiner* — Marc Armand
*Assistant Examiner* — Lawrence-Linh T Nguyen
(74) *Attorney, Agent, or Firm* — Winston Hsu; Scott Margo

(57) ABSTRACT

A semiconductor power device includes a substrate, a first semiconductor layer on the substrate, a second semiconductor layer on the first semiconductor layer, and a third semiconductor layer on the second semiconductor layer. At least a recessed epitaxial structure is disposed within a cell region and the recessed epitaxial structure may be formed in a pillar or stripe shape. A first vertical diffusion region is disposed in the third semiconductor layer and the recessed epitaxial structure is surrounded by the first vertical diffusion region. A source conductor is disposed on the recessed epitaxial structure and a trench isolation is disposed within a junction termination region surrounding the cell region. In addition, the trench isolation includes a trench, a first insulating layer on an interior surface of the trench, and a conductive layer filled into the trench, wherein the source conductor connects electrically with the conductive layer.

20 Claims, 19 Drawing Sheets

SEMICONDUCTOR POWER DEVICE

BACKGROUND OF THE INVENTION

1. Field of the Invention

This present invention generally relates to the field of semiconductor power devices. More particularly, the present invention relates to a semiconductor power device with a super junction.

2. Description of the Prior Art

A power device is used in power management; for example, in a switching power supply, a management integrated circuit in the core or peripheral region of a computer, a backlight power supply, and in an electric motor control. The type of power devices described above include an insulated gate bipolar transistor (IGBT), a metal-oxide-semiconductor field effect transistor (MOSFET), and a bipolar junction transistor (BJT), among which the MOSFET is the most widely applied because of its energy saving properties and ability to provide faster switching speeds.

In a conventional power device with a super-junction, a high voltage device is disposed in a cell region surrounded by a junction termination region. In general, concentric ring-shaped trenches surround the cell region layer-by-layer and function as a voltage sustaining structure in the termination region. During a regular operation of the device, however, the voltage sustaining structure is usually not robust enough to sustain a high voltage resulting from a source region for a long time. As a consequence, the phenomenon of an electrical breakdown occurs and the efficiency of the device is reduced. Accordingly, there is a need for providing a voltage sustaining structure which can improve the voltage sustaining ability and further ramp up the reliability of the device.

SUMMARY OF THE INVENTION

To address these and other objectives, the present invention provides a semiconductor power device, which comprises a substrate having a first conductivity type; a first semiconductor layer having a second conductivity type on the substrate; a second semiconductor layer having the second conductivity type on the first semiconductor layer a third semiconductor layer having the second conductivity type on the second semiconductor layer; at least a recessed epitaxial structure having the first conductivity type embedded in the third semiconductor layer, wherein the recessed epitaxial structure is disposed in a cell region; a first vertical diffusion region having the first conductivity type in the third semiconductor layer, the first vertical diffusion region surrounding the recessed epitaxial structure; a source conductor disposed on the recessed epitaxial structure; and a trench isolation disposed within a junction termination region surrounding the cell region, wherein the trench isolation comprises a trench, a first insulating layer on an interior surface of the trench, and a conductive layer filled into the trench, and wherein the source conductor is electrically connected to the conductive layer.

In another aspect, the present invention provides a semiconductor power device, which comprises a substrate having a first conductivity type; a dielectric layer on the substrate; a semiconductor layer having a second conductivity type on the dielectric layer; a drift layer having the second conductivity type on the semiconductor layer; at least a recessed epitaxial structure having the first conductivity type embedded in the drift layer, wherein the recessed epitaxial structure is disposed in a cell region; a vertical diffusion region having the first conductivity type in the drift layer, the vertical diffusion region surrounding the recessed epitaxial structure; a source conductor disposed on the recessed epitaxial structure; and a trench isolation disposed within a junction termination region surrounding the cell region, wherein the trench isolation comprises a trench, an insulating layer on an interior surface of the trench, and a conductive layer filled into the trench, and wherein the source conductor is electrically connected to the conductive layer.

The present invention provides an insulating layer which is located in the trench isolation within a junction termination region. The insulating layer can effectively enhance the voltage sustaining ability and therefore improve the reliability of the device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
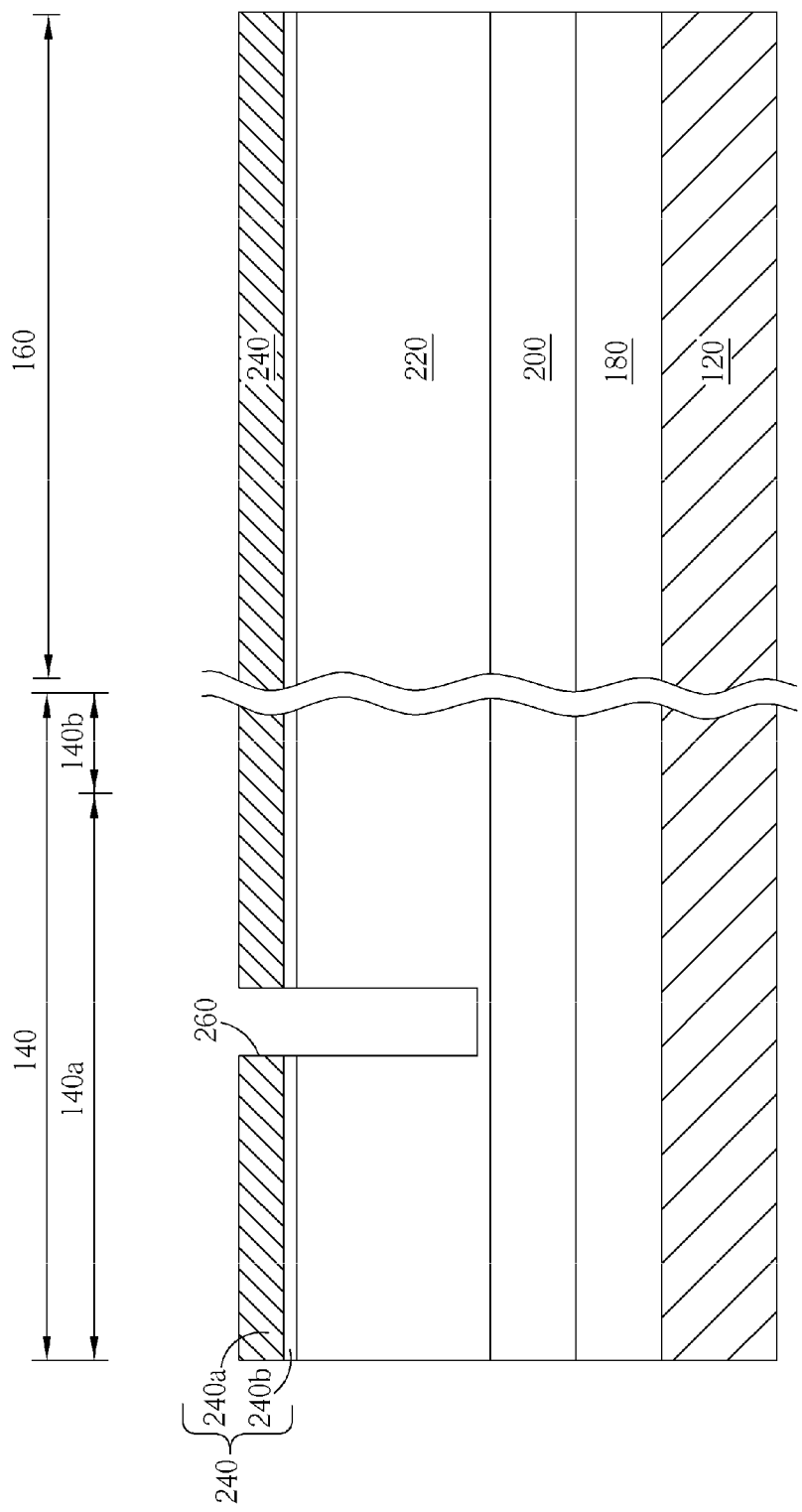
FIGS. 1-18 are schematic, cross-sectional diagrams illustrating a method for fabricating a semiconductor power device in accordance with one embodiment of this invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

Please refer to FIGS. 1-18. FIGS. 1-18 are schematic diagrams illustrating a method for fabricating a semiconductor power device in accordance with one embodiment of the present invention.

In a preferred embodiment of this invention, as shown in FIG. 1, a substrate 120 of a first conductivity type is provided which is a P type silicon substrate. A super junction power MOS region 140 and a peripheral MOS region 160 are defined within the substrate 120, wherein a cell region 140a and a junction termination region 140b surrounding the cell region 140a are defined within the super junction power MOS region 140. The cell region 140a is used to accommodate a semiconductor device, such as a MOSFET and the junction termination region 140b comprises a voltage sustaining structure which can function as a barrier for preventing the spreading of a high intensity electric field generated from the cell region 140a.

A first semiconductor layer 180 of the second conductivity type, a second semiconductor layer 200 of the second conductivity type, and a third semiconductor layer 220 of the second conductivity type are grown on the substrate 120 sequentially via an epitaxial growth process. According to the preferred embodiment of the invention, the first semiconductor layer 180, the second semiconductor layer 200, and the third semiconductor layer 220 may be N type epitaxial layers, wherein the doping concentration of the second semiconductor layer 200 is higher than that of the first semiconductor layer 180 and the third semiconductor layer 220. The third semiconductor layer 220 functions as a drift layer which allows carriers to drift through. The above-mentioned epitaxial growth process may adopt a chemical vapor deposition (CVD) process or any other appropriate methods.

Still referring to FIG. 1, a hard mask layer 240 is formed on the third semiconductor layer 220 to protect the third semiconductor layer 220 from damage in the following etching process. The composition of an upper hard mask layer 240a may be $Si_3N_4$ and the composition of a lower hard mask layer (or pad layer) 240b may be $SiO_2$. Next, a photolithography and an etching process are carried out to etch at least a trench 260 into the hard mask 240 and the third semiconductor layer 220 within the cell region 140a. It should be noted that, according to this embodiment, the bottom of the trench 260 is slightly above the interface between the third semiconductor layer 220 and the second semiconductor layer 200.

Figure 2:
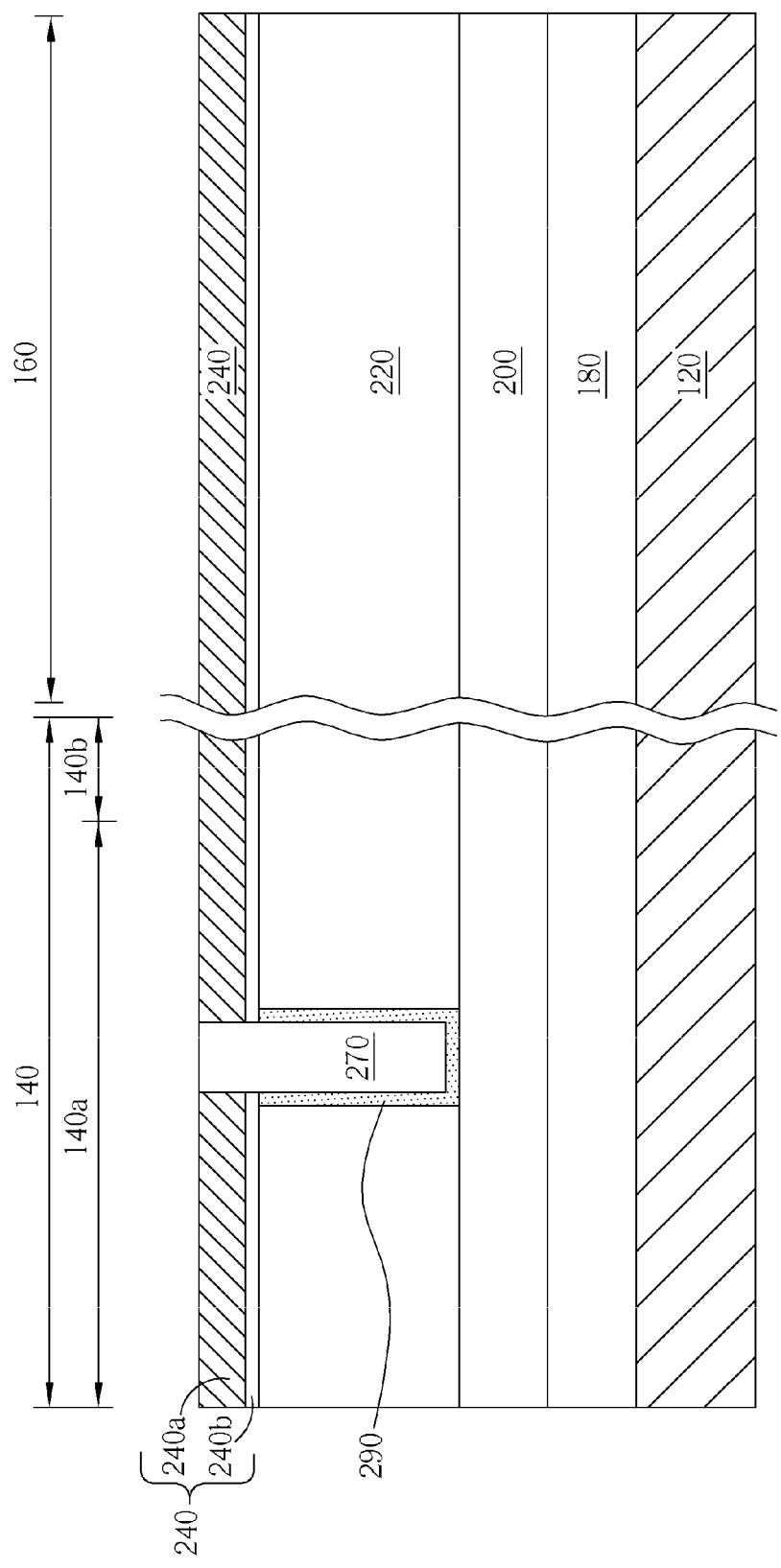

As shown in FIG. 2, a dopant source layer 270 of the first conductivity type (for example, borosilicate glass (BSG), but not limited thereto) is deposited on the surface of the hard mask layer 240 and fills up the trench 260. Next, the dopant source layer 270 on the surface of the hard mask layer 240 is moved by performing an etching back process followed by a thermal drive-in process to diffuse dopants inside the dopant source layer 270 into the third semiconductor layer 220. A first vertical diffusion region 290 is thereby formed surrounding the trench 260. As a consequence, at least a vertical PN junction is formed in the third semiconductor layer 220, the structure of which is called a super junction.

Figure 3:
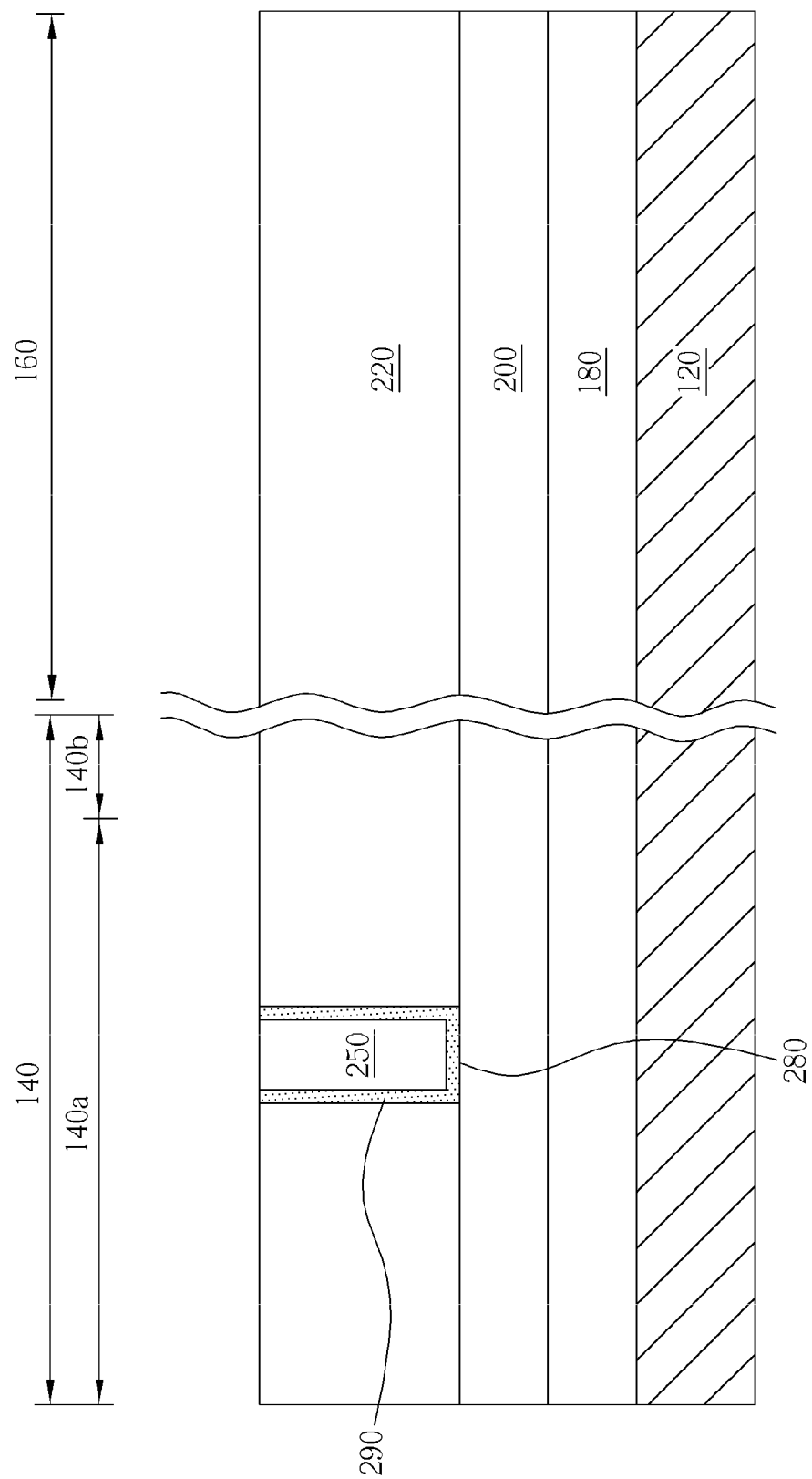

As depicted in FIG. 3, after the above-mentioned process, the dopant source layer 270 and the upper hard mask layer 240a are completely removed. A recessed epitaxial structure 280 is formed by carrying out an epitaxial growth process to grow an epitaxial layer 250 with the first conductivity in the trench 260. Next, in order to align the top surface of the recessed epitaxial structure 280 with the surface of the third semiconductor layer 220, an etching back process is performed. Finally, the lower hard mask layer 240b is eliminated in order to expose the surface of the third semiconductor layer 220.

Figure 4:
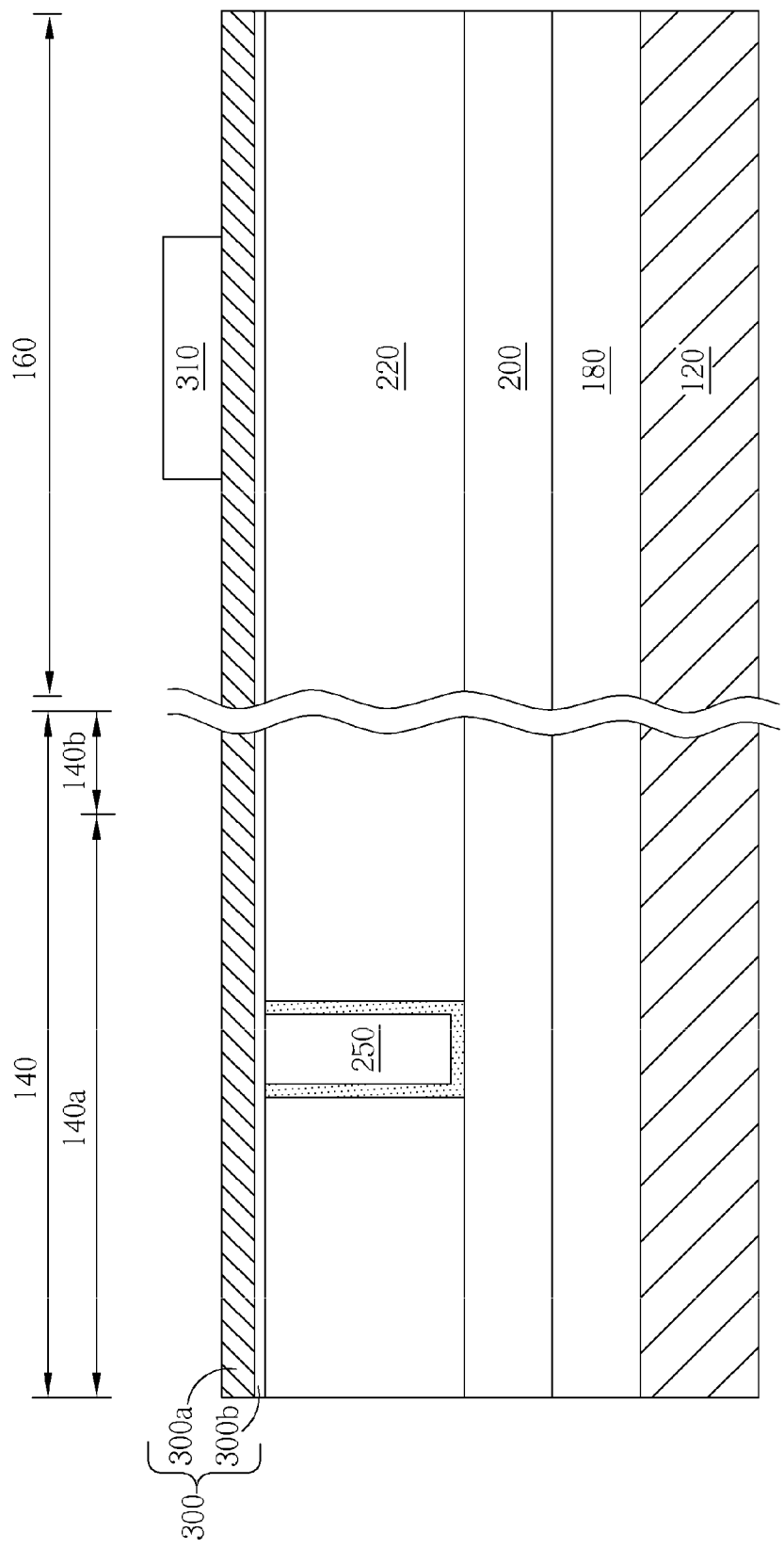
Figure 5:
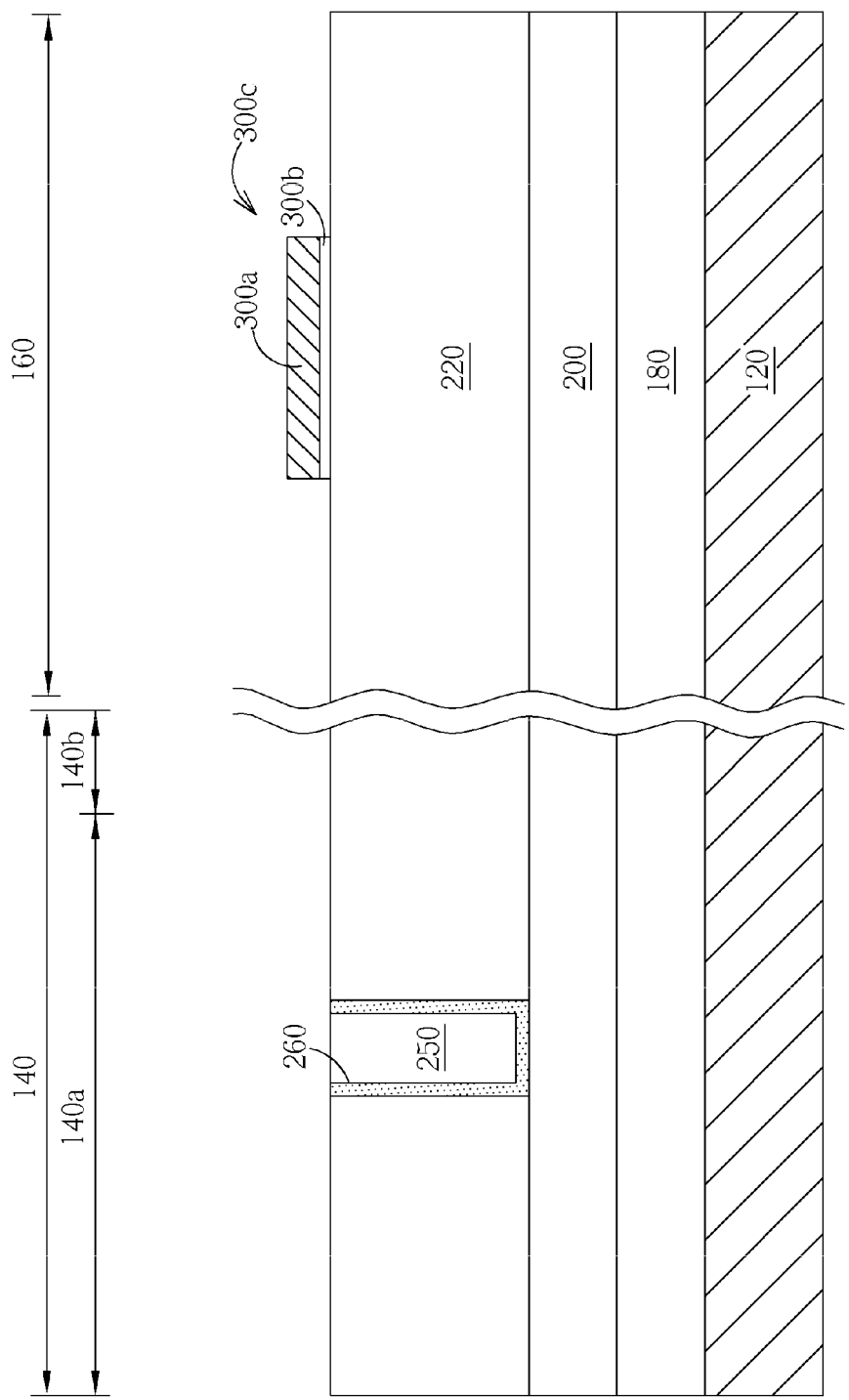
Figure 6:
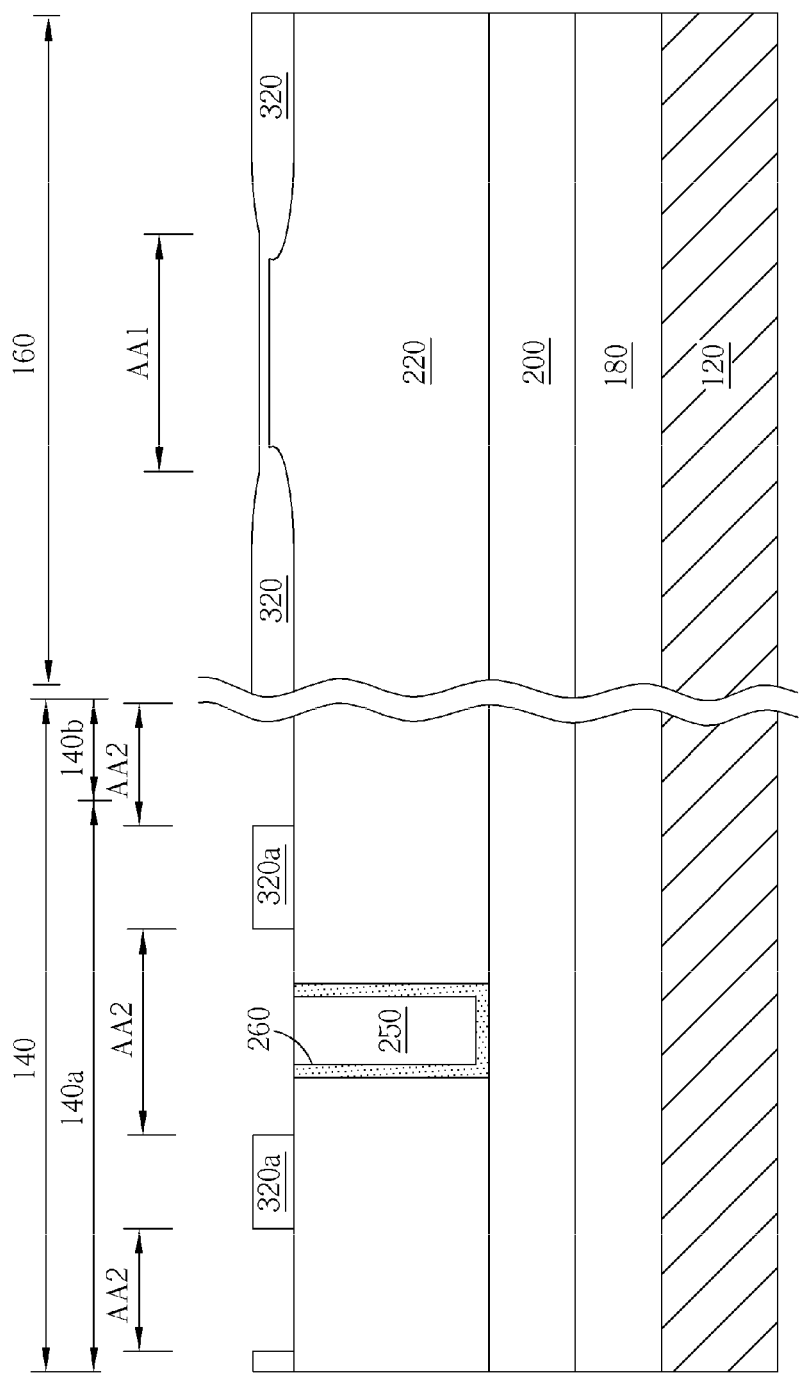

As shown in FIG. 4, a pad layer 300, which can be divided into two parts, is formed on the third semiconductor layer 220. The composition of an upper pad layer 300a may be $Si_3N_4$ and the composition of a lower pad layer 300b may be $SiO_2$. Next, a photolithography process is carried out to form a photoresist pattern 310 on the pad layer 300 within the peripheral MOS region 160. The photoresist pattern 310 is used to define a desire active region pattern in the following sequence. As illustrated in FIG. 5, the pad layer 300 not covered by the photoresist pattern 310 is removed via an etching process. Therefore, an active area pattern 300c is formed by transferring the layout of the photoresist pattern 310 into the pad layer 300. Finally, the photoresist pattern 310 is removed. Referring to FIG. 6, by applying a thermal oxidation process and etching process, a field oxidation layer 320 and an active area AA1 are formed within the peripheral MOS region 160. A field oxidation layer 320a and an active area AA2 are formed within the super junction power MOS region 140 by photolithography and etching process. Then, the pad layer 300C is removed. It is worth noting that the oxidation pattern 320a is disposed on the surface of the third semiconductor layer 220 near the trench 260 and is used to improve the reliability of the device.

Figure 7:
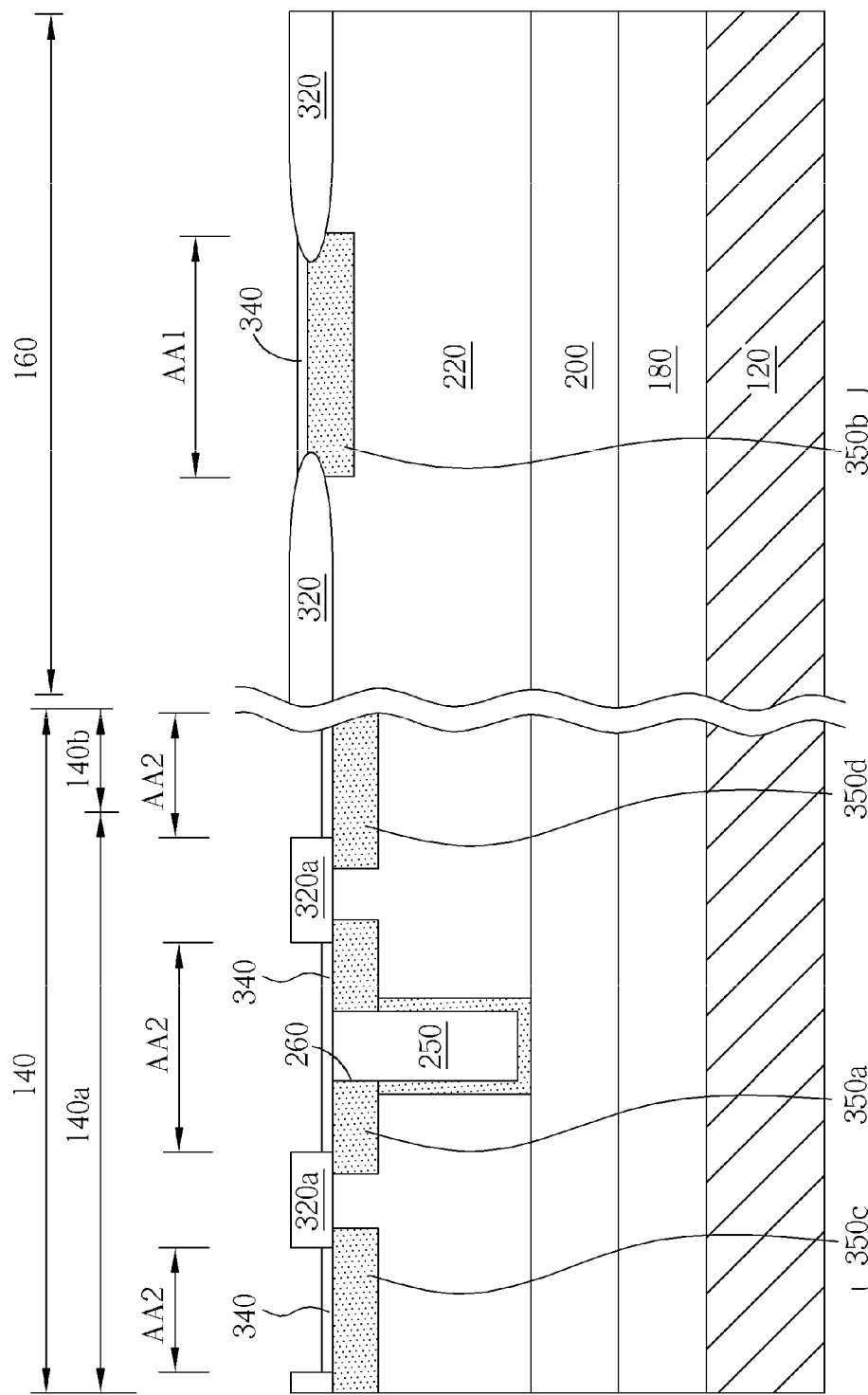

As demonstrated in FIG. 7, an oxidation layer 340 is formed on the exposed surface of the third semiconductor layer 220 and then an ion implantation process is carried out to form ion wells 350 at the upper region of the third semiconductor layer 220. The ion wells 350 include a first ion well 350a located around the trench 260, an ion well 350d at the junction termination region 140b, an ion well 350b at the active area AA1, and an ion well 350c disposed at the cell region 140a, wherein the ion wells 350 have the first conductivity type. After performing the ion implantation process, an anneal process may be carried out to activate dopants inside the wells 350.

Figure 8:
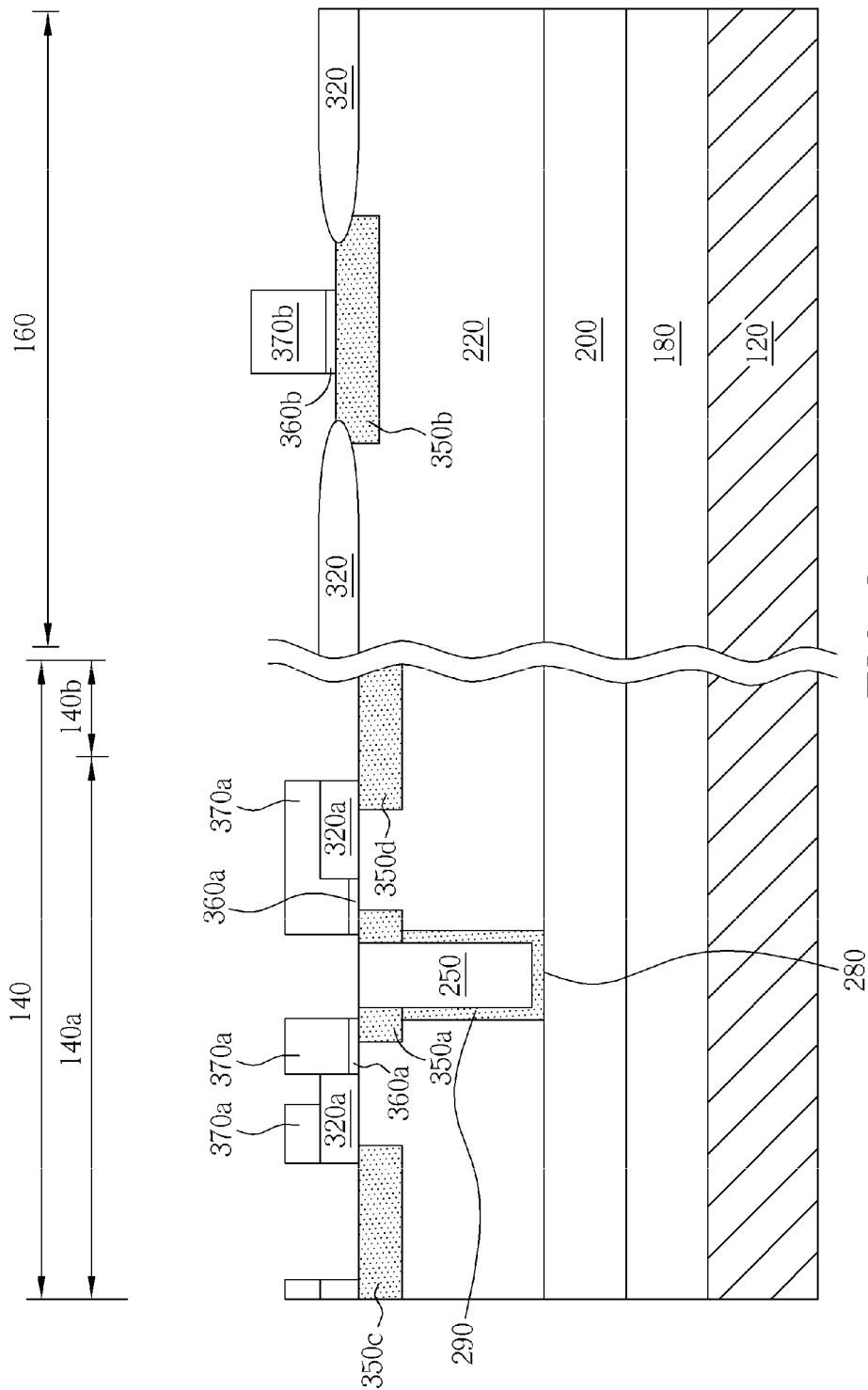
Figure 9:
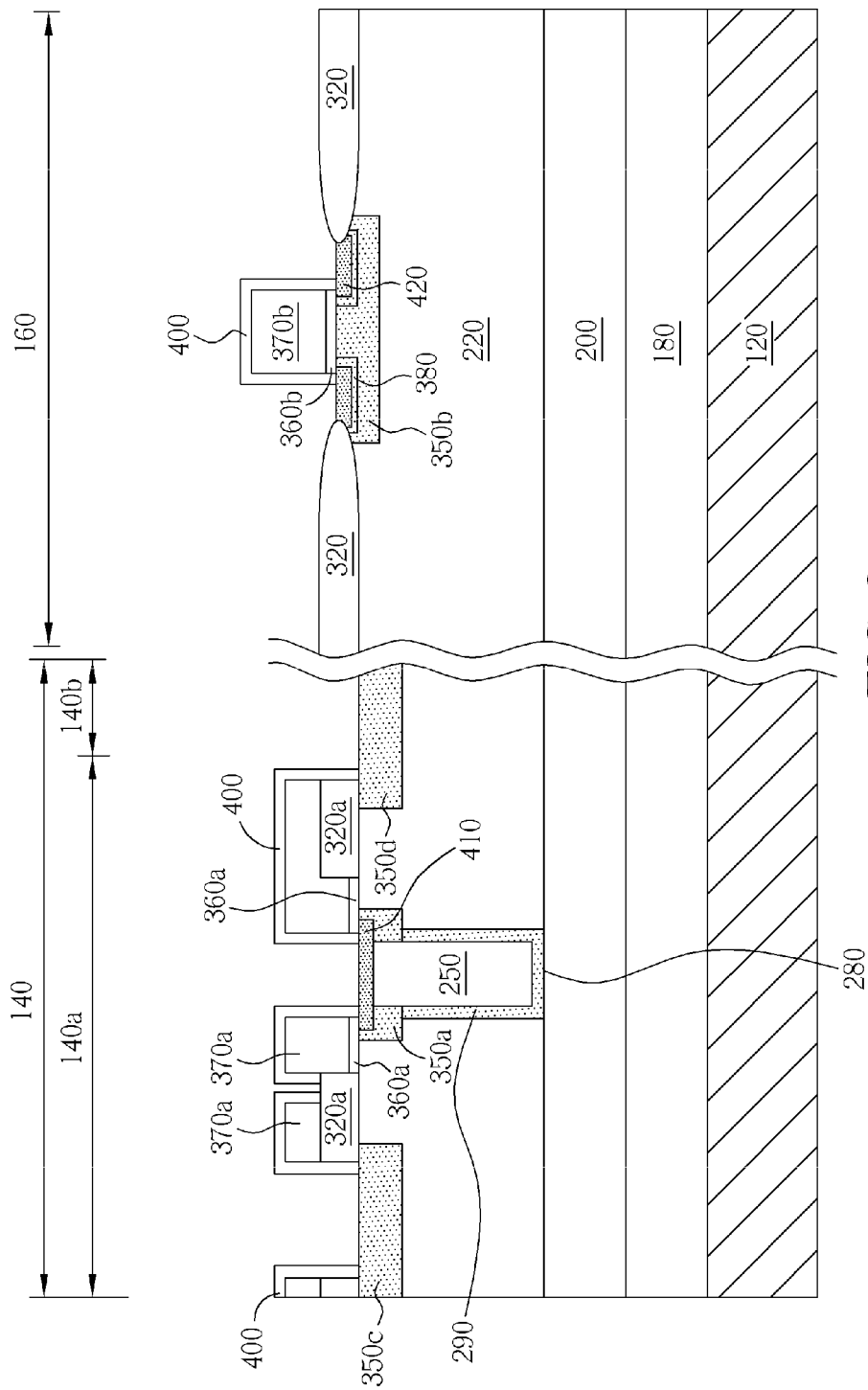

Next, as shown in FIG. 8, the oxidation layer 340 is removed (not shown) followed by applying an oxidation process or a polysilicon CVD deposition process to form a gate layer. Subsequently, by performing a photolithography and etching process, patterned gate oxide layers 360a, 360b and polysilicon gate layers 370a, 370b are formed and the gate oxide layers 360a, 360b are within the super junction power MOS region 140 and the peripheral MOS region 160, respectively. In addition, all polysilicon gate patterns 370a are located within the super junction power MOS region 140 and a polysilicon gate pattern 370b is located within the peripheral MOS region 160. Please refer to FIG. 9. A lightly doped region 380 of the second conductivity type is formed inside the ion well 350b via an ion implantation process. A spacer 400 conformally covers the surface of the polysilicon gate patterns 370a, 370b, wherein the spacer 400 includes silicon oxide or silicon nitride, but is not limited thereto. An ion implantation process is carried out to form a first heavily doped region 410 located in the upper part of the recessed epitaxial structure 280, wherein the first heavily doped region 410 is located inside the first ion well 350a and is of the second conductivity type. At the same time, a heavily doped region 420 is formed beside the polysilicon gate pattern 370b via the same ion implantation process.

Figure 10:
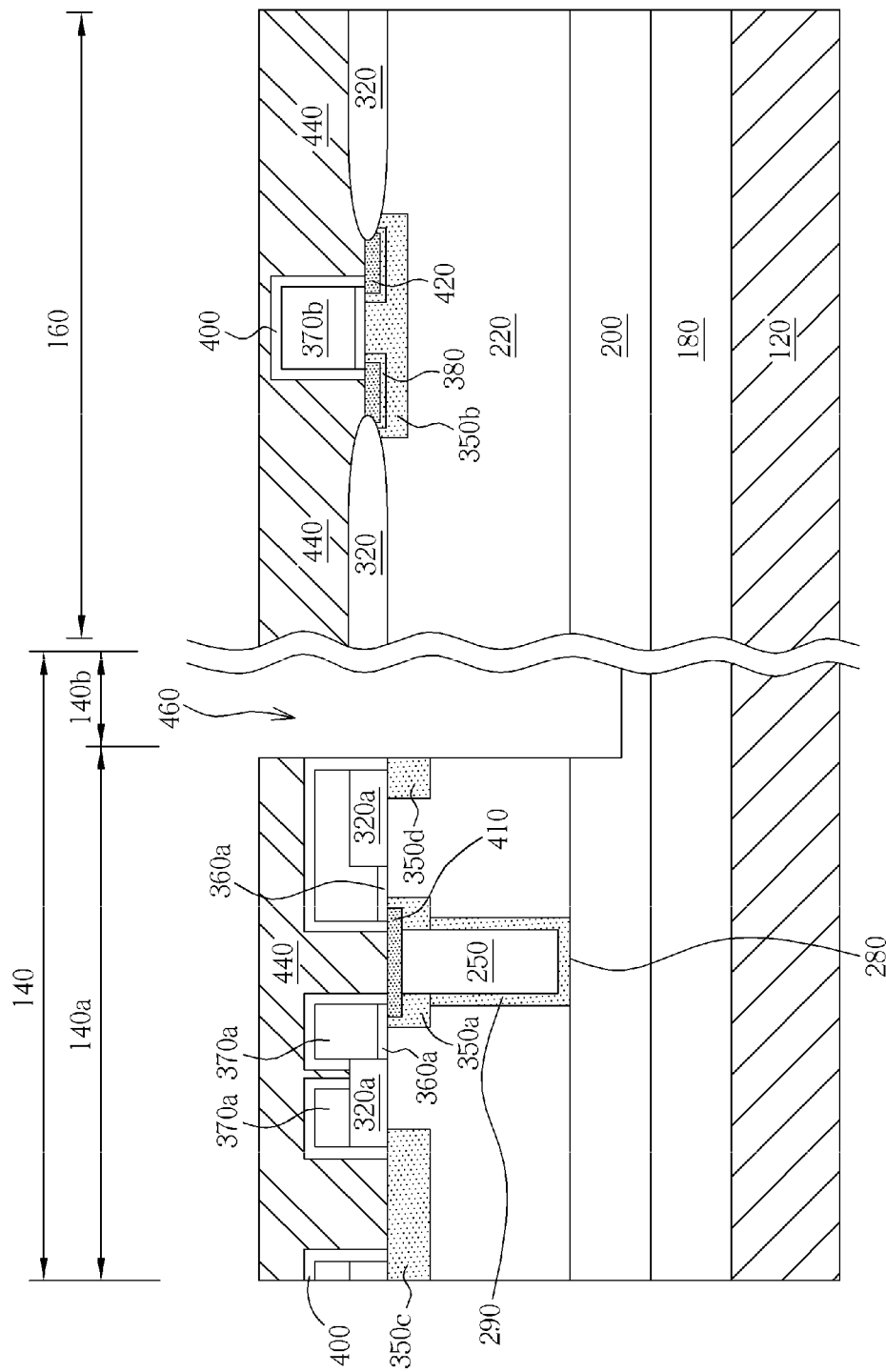
Figure 11:
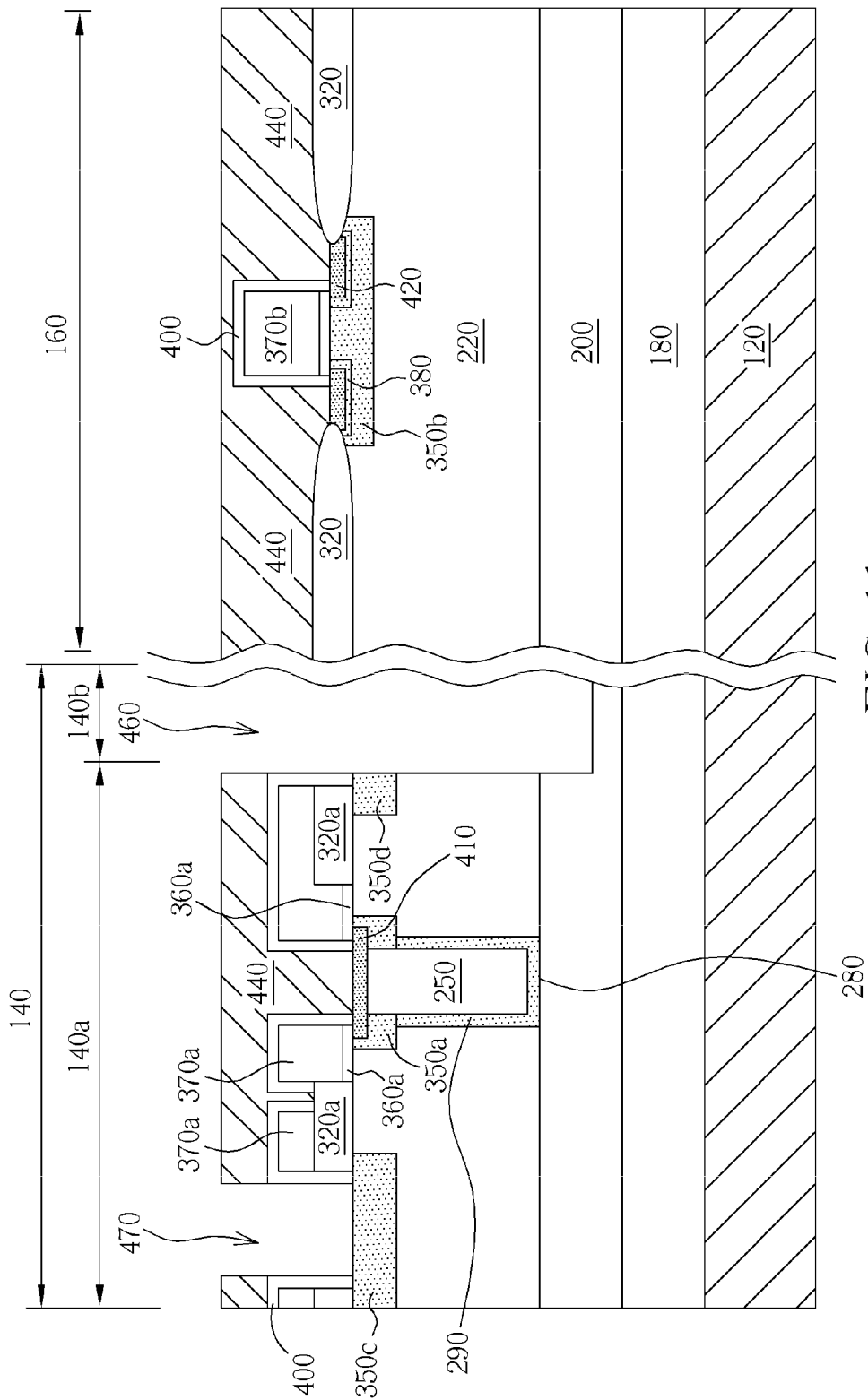
Figure 12:
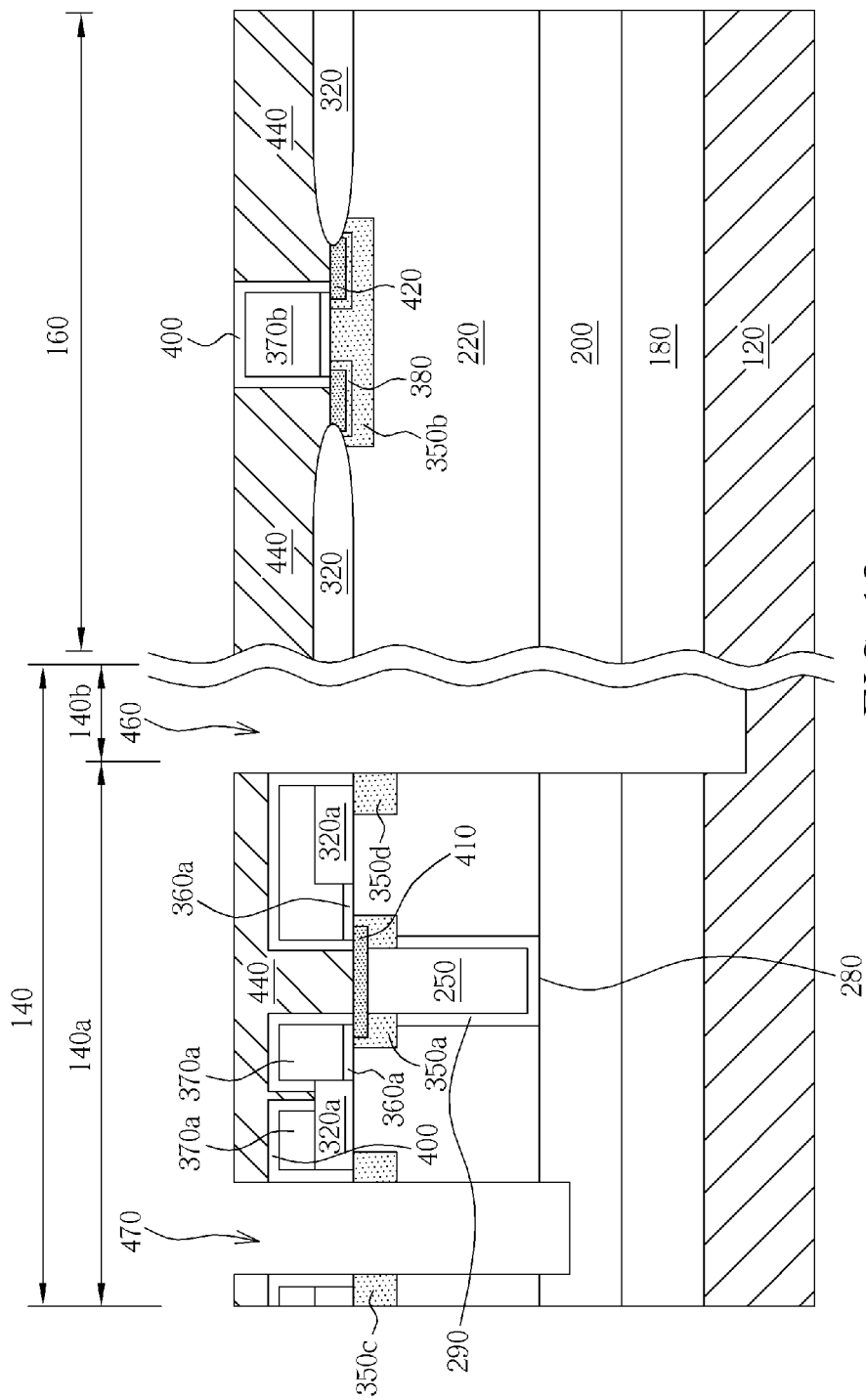

As shown in FIG. 10, an inter layer dielectric (ILD) 440 is formed to cover the entire surface of the super junction power MOS region 140 and the peripheral MOS region 160. An etching back process is performed to planarize the inter layer dielectric 440. A trench 460, whose bottom is located in the second semiconductor layer 200, is etched into the junction termination region 140b by a photolithography and etching process. It should be noted that the bottom of the trench 460 is not deep enough to expose the first semiconductor layer 180. In the invention, the inter layer dielectric 440 may function as a protective layer to prevent the covered third semiconductor layer 220 from damage during the formation of the trench 460. Further, as shown in FIG. 11, by performing another photolithography and etching process, a drain contact hole 470 is defined in the inter layer dielectric 440 within the cell region 140a. Therefore, part of the surface of the ion well 350c is now exposed from the bottom of the source contact hole 470. Referring to FIG. 12, yet another etching process is performed and thereby the bottom of the drain contact hole 470 may extend into the second semiconductor layer 200 and the bottom of the trench 460 can reach the substrate 120.

Figure 13:
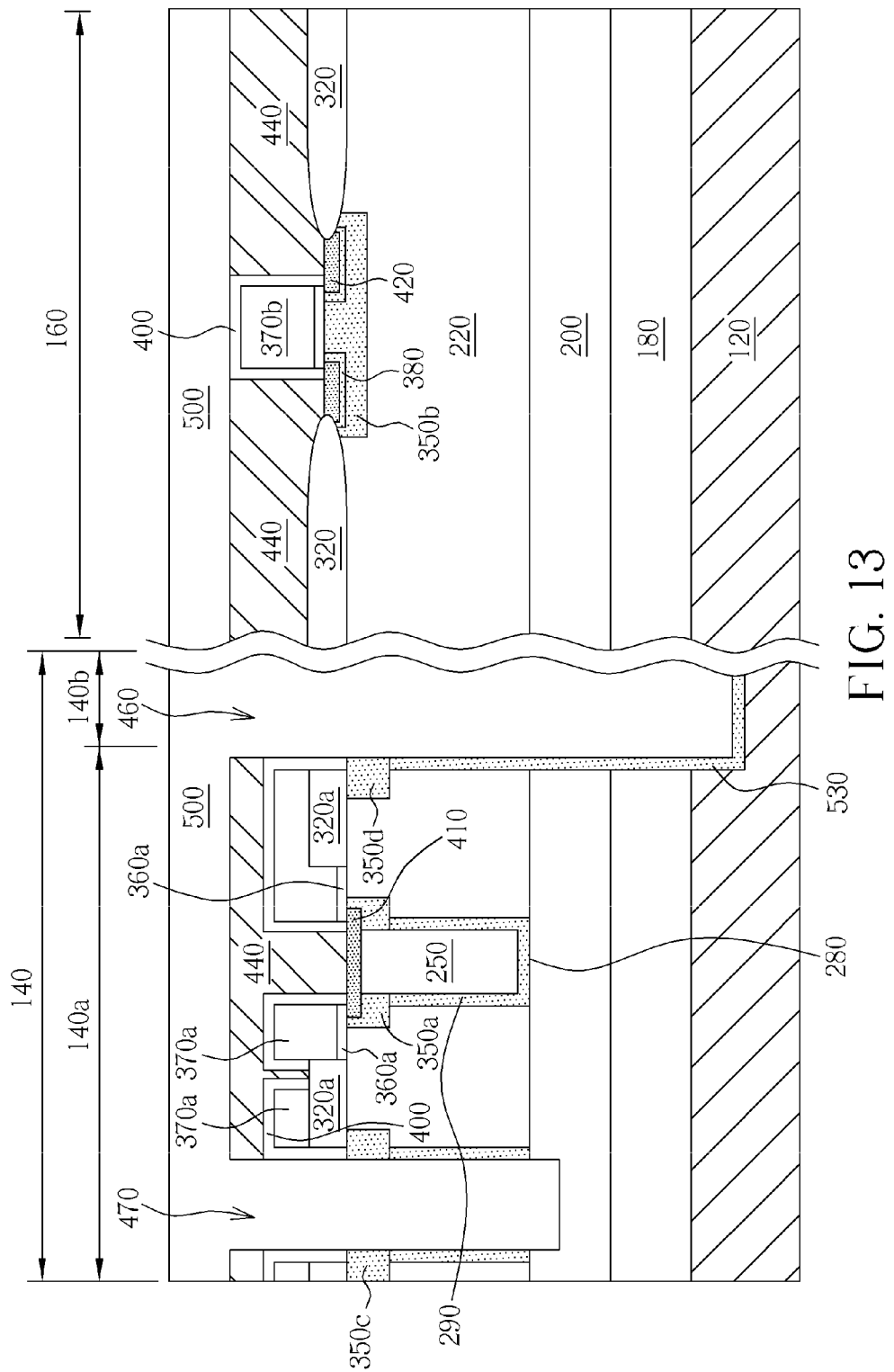
Figure 14:
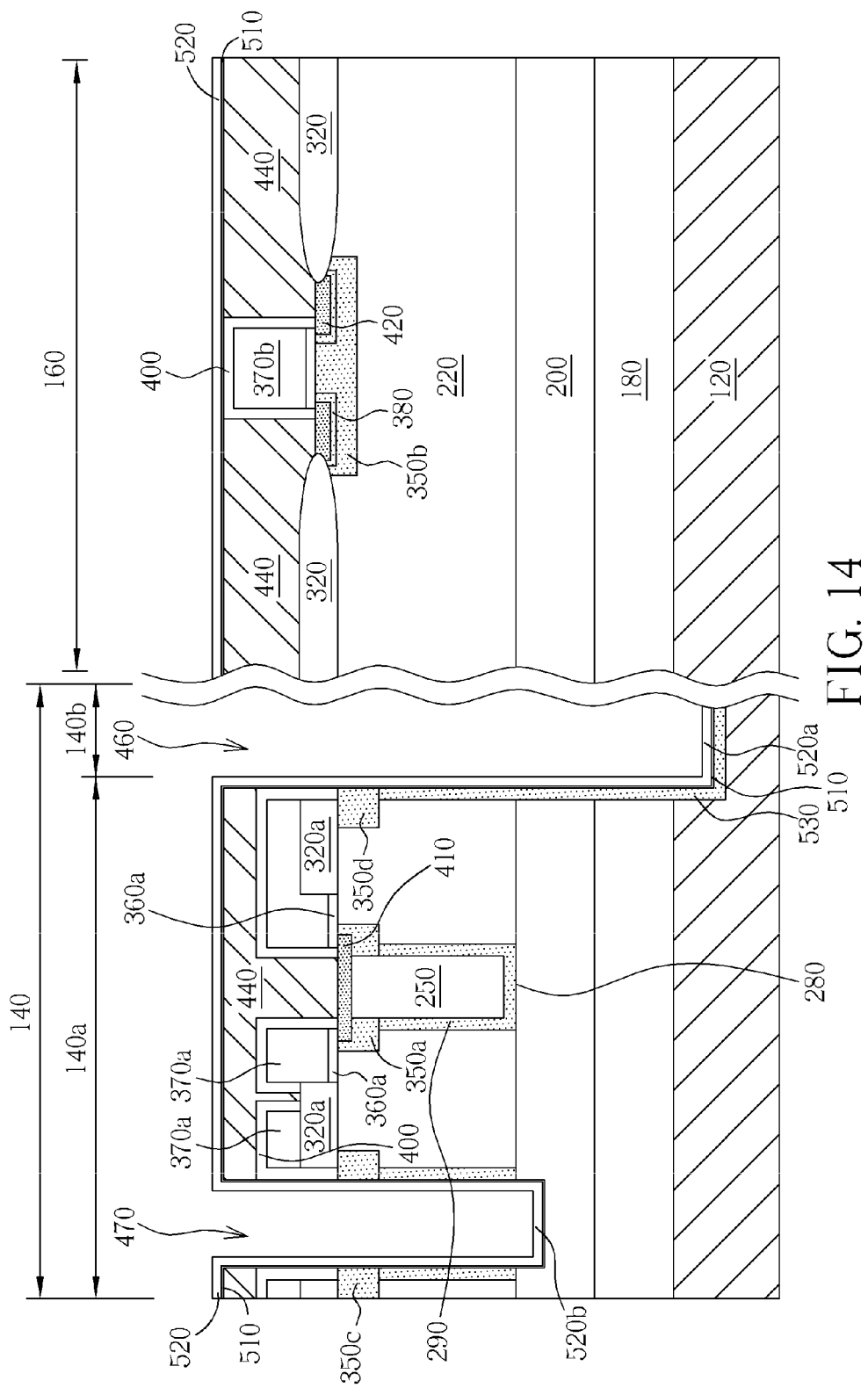
Figure 15:
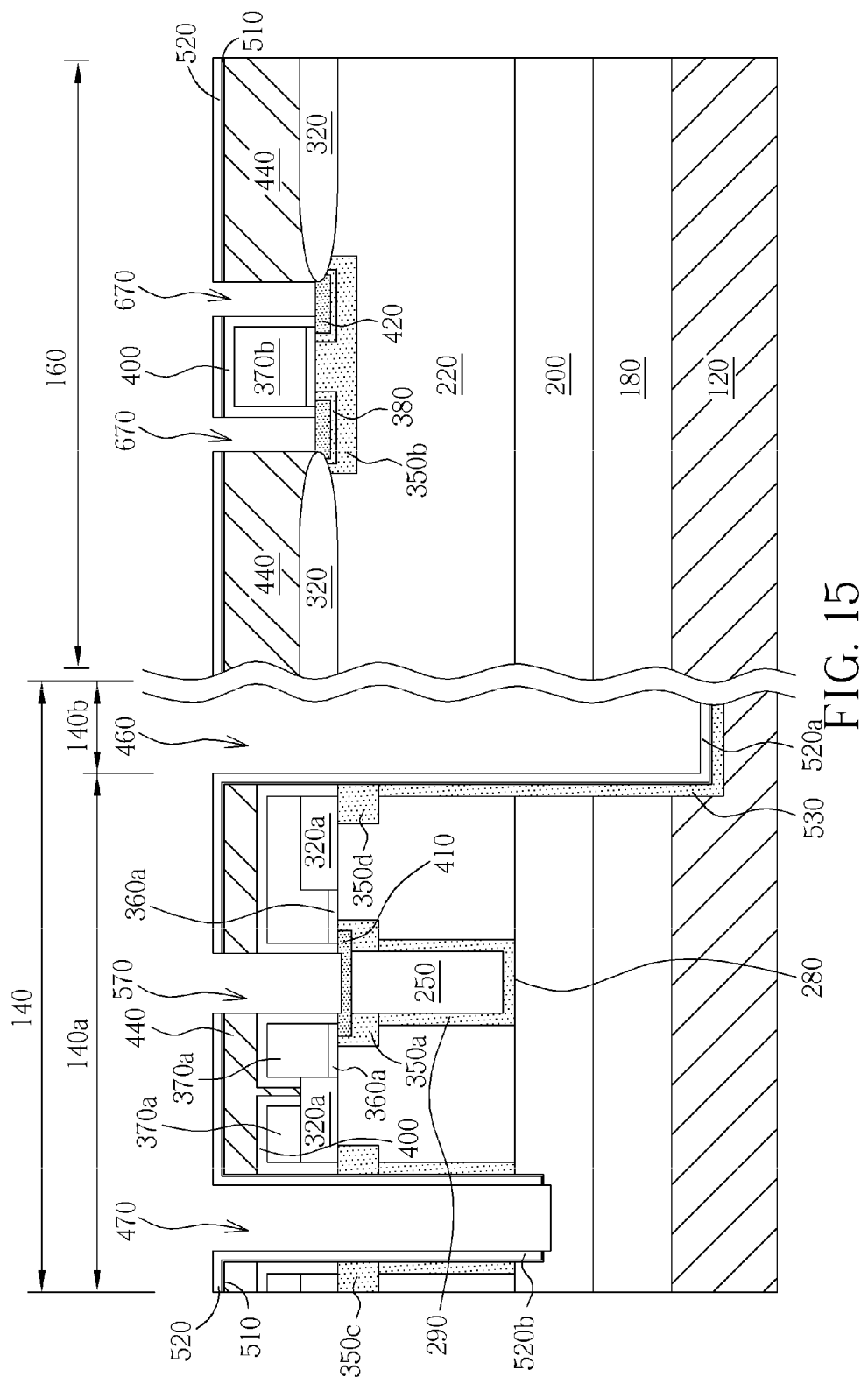
Figure 16:
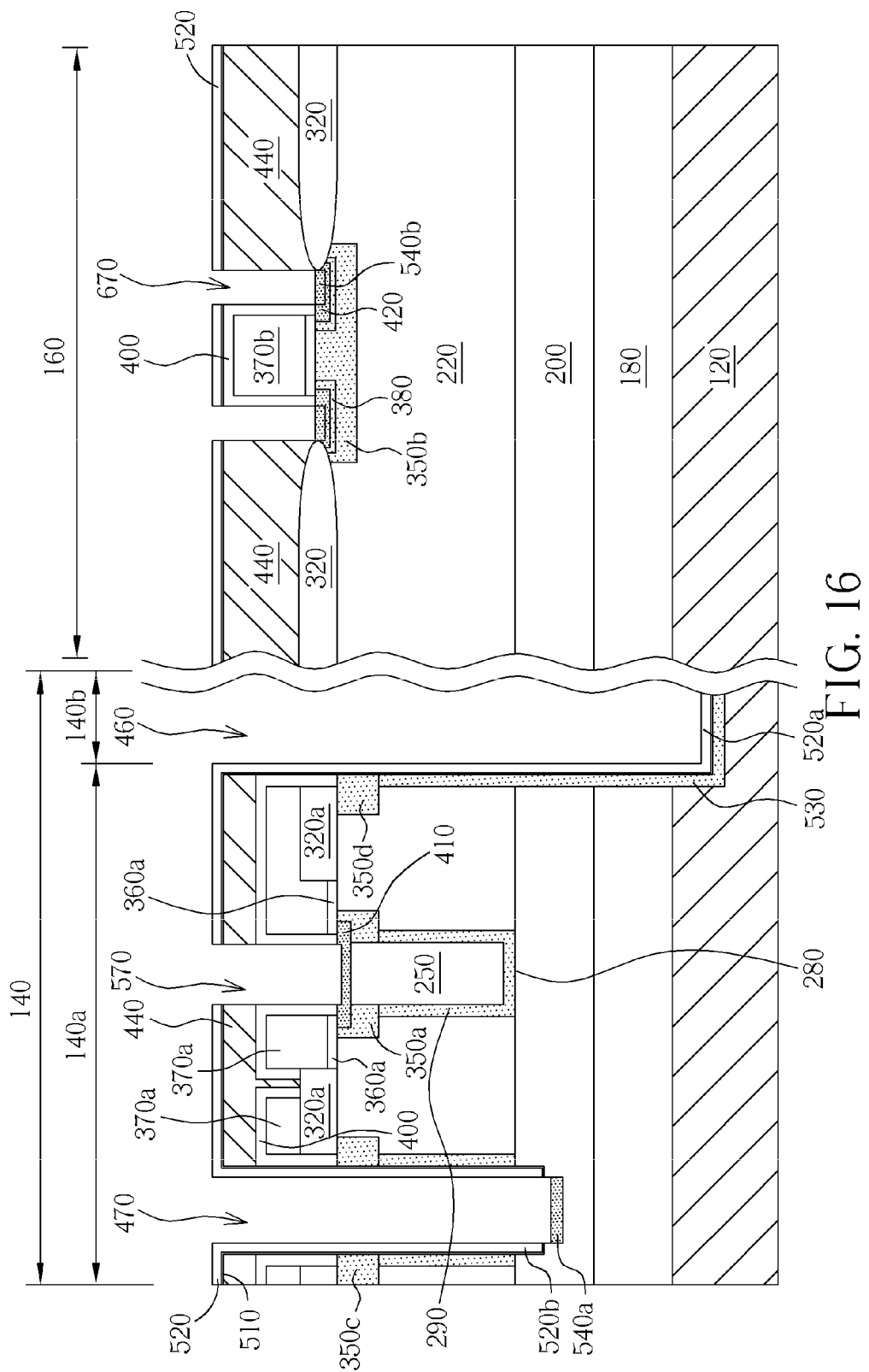
Figure 17:
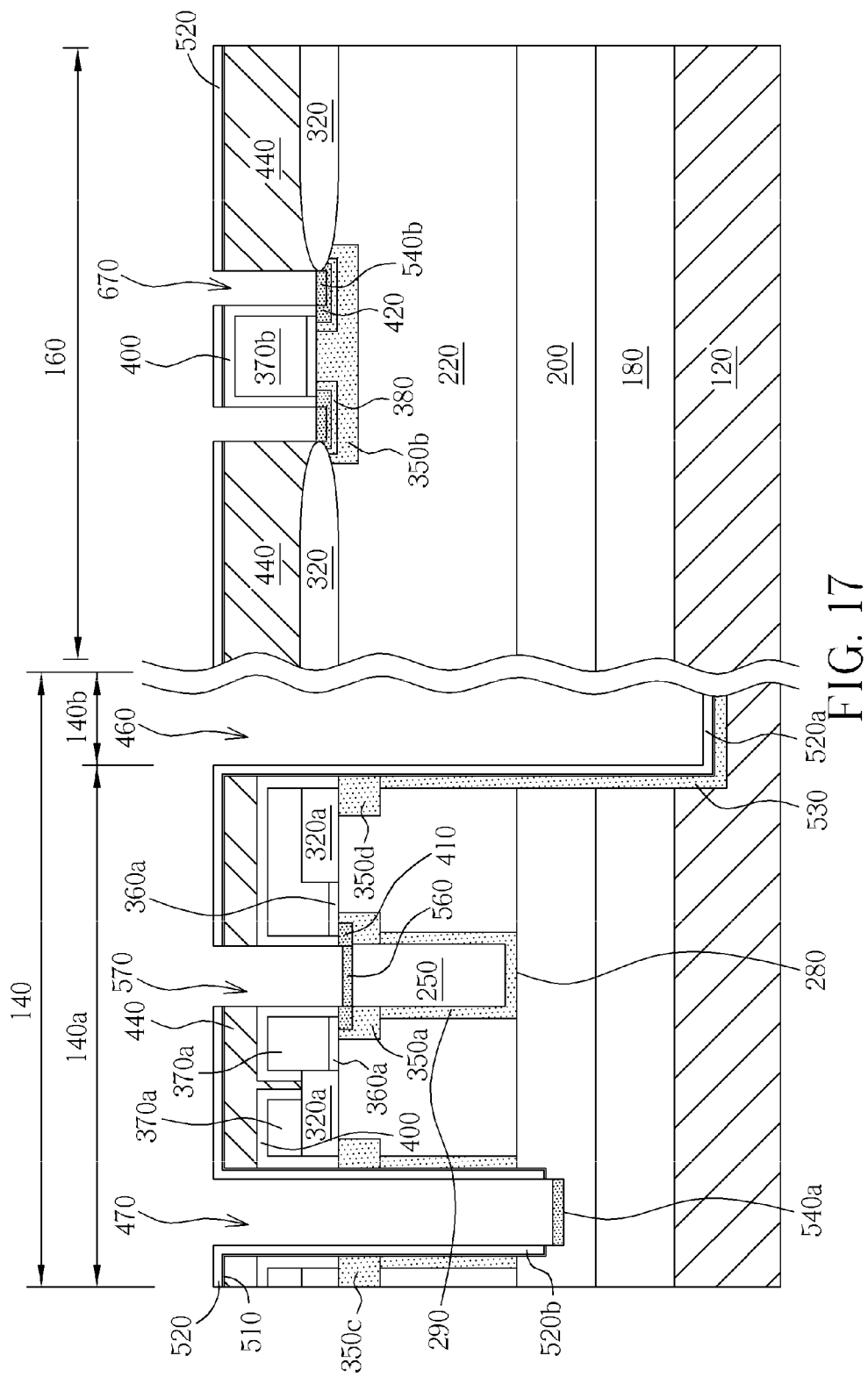

As depicted in FIG. 13, for the purpose of forming a PN junction around the trench, a dopant source layer 500 with the first conductivity type, e.g. borosilicate glass (BSG), fills up the trench 460 and the source contact hole 470. By performing a thermal dive-in process, dopants in the dopant source layer 500 are not only diffused into the third semiconductor layer 220, the second semiconductor layer 200, the first semiconductor layer 180, and the substrate 120 but also activated concurrently. As a consequence, a second vertical doping region 530 is formed and surrounds the trench 460. As shown in FIG. 14, the removal of the dopant source layer 500 (not shown) is carried out. A liner 510 (for example, silicon oxide) is formed on the interior surface of the trench 460 and the drain contact hole 470 via a thermal oxidation process. In order to improve the voltage sustaining ability, a first insulating layer 520a and a second insulating layer 520b are further deposited on the interior surface of the trench 460 and drain contact hole 470, respectively, via a chemical vapor deposition (CVD) process. In this case, the surface of the inter layer dielectric 440 is covered by the liner 510 and an insulating layer 520. Referring to FIG. 15, after forming the voltage sustaining structure, a photolithography and etching process is performed. Therefore, part of the second semiconductor layer 200 is exposed from the bottom of the drain contact hole 470 and part of the surface of the first heavily doped region 410 is also exposed from the bottom of a source contact hole 570. A contact hole 670 is also formed during the previous etching process to therefore expose part of the heavily doped region 420 within the peripheral MOS region 160. As shown in FIG. 16, by performing an ion implantation process, doped regions 540a, 540b are formed under the bottom of the source contact hole 470 and at the heavily doped region 420, respectively, wherein the doped region 540a is located in the second semiconductor layer 200. Referring to FIG. 17, another ion implantation process is carried out to form a second heavily doped region 560 at the upper side of the recessed epitaxial structure 280. The function of the second heavily doped region 560 is the same as that of the doped regions 540a, 540b, i.e. it is used to improve the conductivity of an interface between a metal layer and a semiconductor layer.

Figure 18:
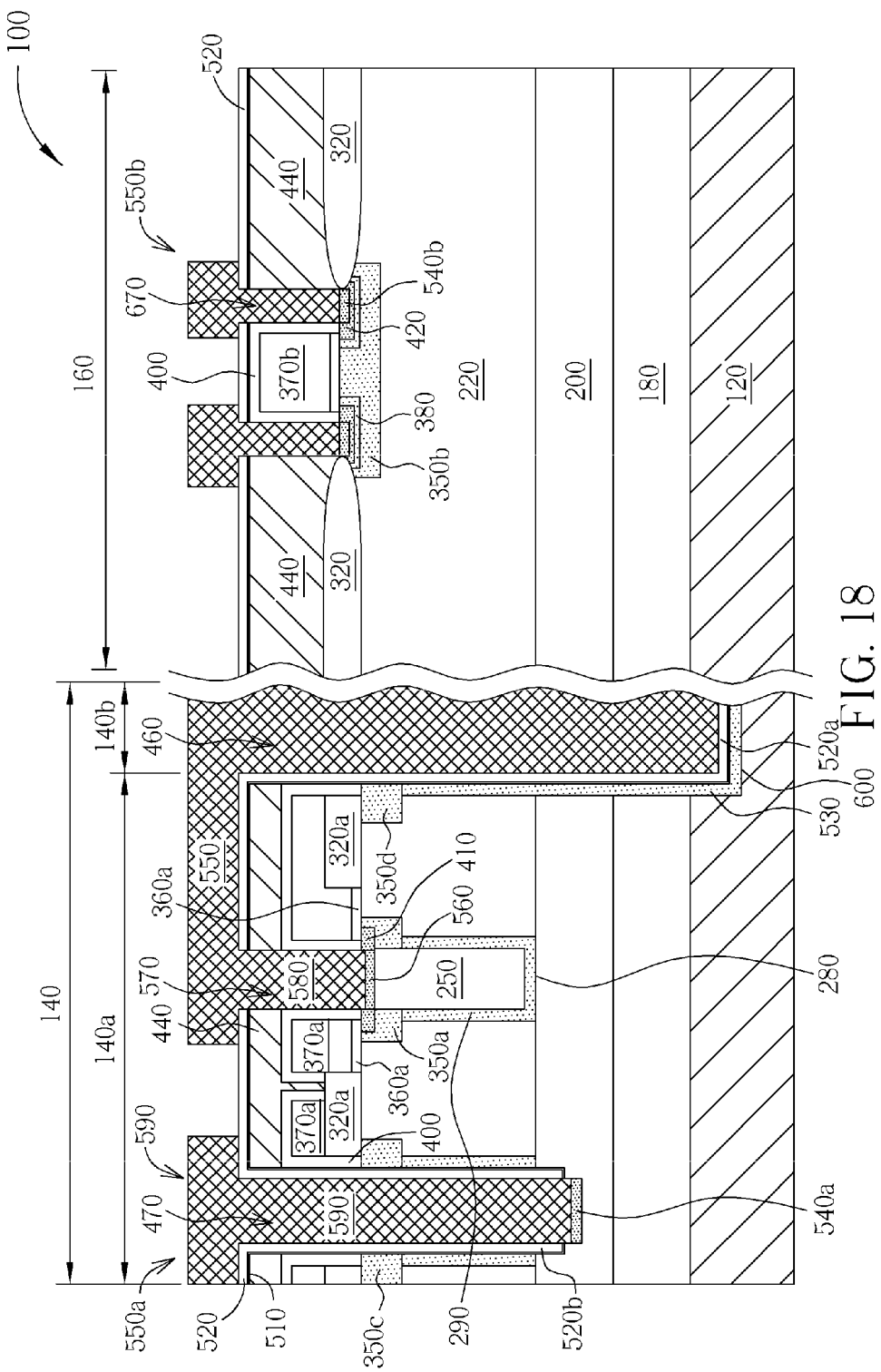

A conductive layer 550, as depicted in FIG. 18, fills up the source contact hole 570, drain contact hole 470, and trench 460. Next, by applying a photolithography and etching process, conductive patterns 550a, 550b are formed within the super junction power MOS region 140 and the peripheral MOS region 160, respectively. The conductive layer 550 may include metal or composite material, e.g. titanium nitride, aluminum, tungsten, or copper etc., but is not limited thereto. The conductive layer 550 located in the source contact hole 570 and in the drain contact hole 470 function as a source conductor 580 and a drain conductor 590, respectively.

At this point, at least a trench isolation 600 is formed, which comprises a trench 460, the first insulating layer 520a disposed on the interior surface of the trench 460, and the conductive layer 550 filled into the trench 460, wherein the source conductor 580 is electrically connected to the conductive layer 550.

The present invention provides a structure of a semiconductor power device, as illustrated in FIG. 18, which includes a substrate 120 having the first conductivity type; the first semiconductor layer 180 having a second conductivity type on the substrate 120; the second semiconductor layer 200 having the second conductivity type on the first semiconductor layer 180; the third semiconductor layer 220 having the second conductivity type on the second semiconductor layer 200; at least a recessed epitaxial structure 280 having the first conductivity type embedded in the third semiconductor layer 220, wherein the recessed epitaxial structure 280 is disposed in a cell region 140a and may be in the form of a stripe-shape or pillar-shape; the first vertical diffusion region 290 having the first conductivity type in the third semiconductor layer 220, and the first vertical diffusion region 290 surrounding the recessed epitaxial structure 280; the source conductor 580 disposed on the recessed epitaxial structure 280; and the trench isolation 600 disposed within the junction termination region 140b surrounding the cell region 140a, wherein the trench isolation 600 comprises the trench 460, the first insulating layer 520a on the interior surface of the deep trench 460, and the conductive layer 550 filled into the trench 460, wherein the source conductor 580 is electrically connected to the conductive layer 550 and the first insulating layer 520a covers and electrically isolates the conductive layer 550.

Figure 19:
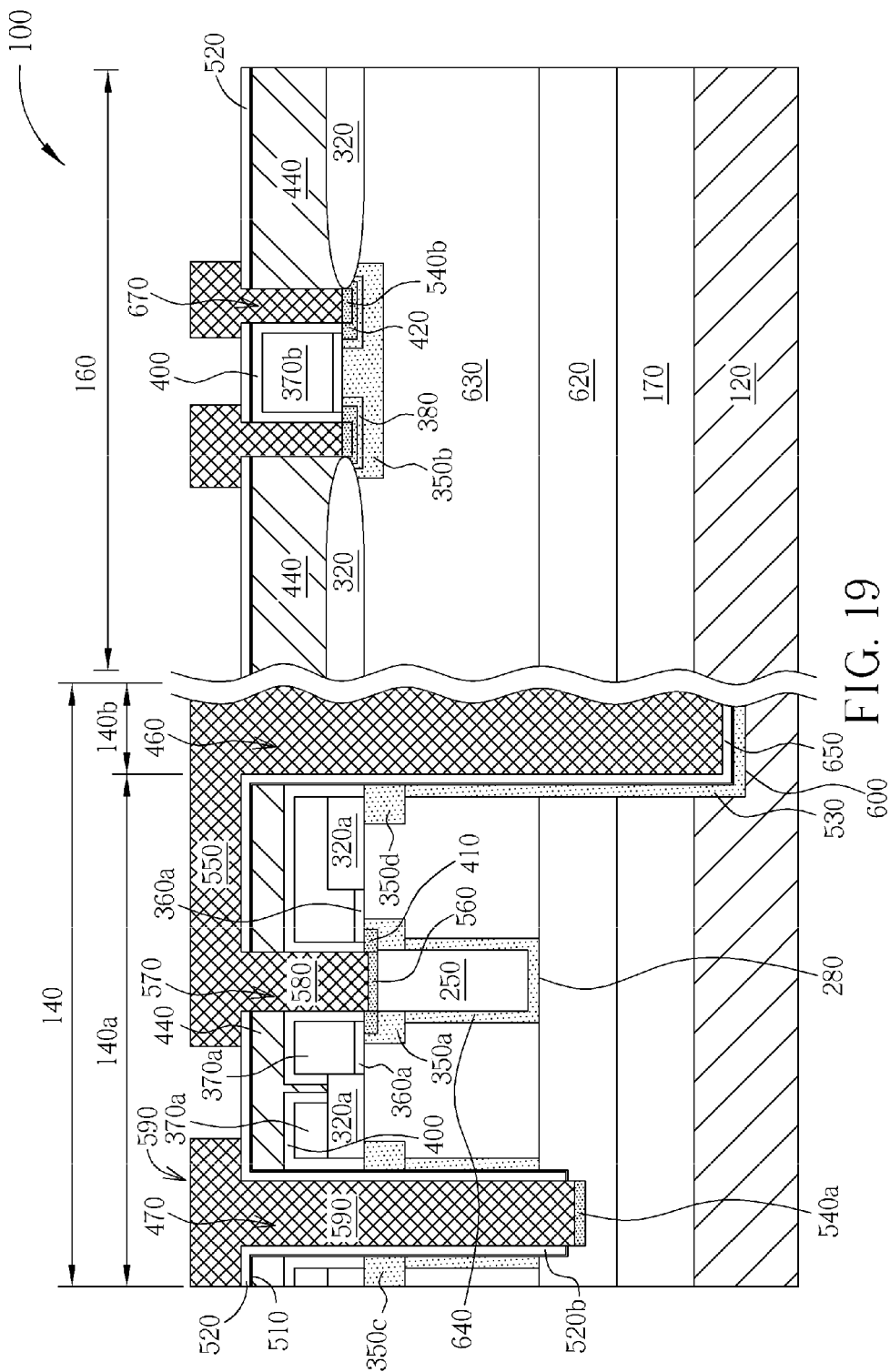
FIG. 19 is a schematic, cross-sectional diagram illustrating a structure of a semiconductor power device in accordance with one embodiment of this invention.

FIG. 19 is a schematic, cross-sectional diagram illustrating a structure of a semiconductor power device in accordance with another embodiment of this invention. The only difference between the structure shown in FIG. 18 and that shown in FIG. 19 is that the substrate 120 is replaced by a silicon-on-insulator (SOI) substrate. Therefore, the following description will focus on the difference between FIG. 18 and FIG. 19, wherein like or similar features will be described with like reference numerals for ease of illustration and description thereof.

As shown in FIG. 19, a semiconductor power device 100 is provided, which includes a substrate 120 having a first conductivity type; a dielectric layer 170 on the substrate 120; a semiconductor layer 620 having a second conductivity type on the dielectric layer 170; a drift layer 630 having the second conductivity type on the semiconductor layer 620; at least a recessed epitaxial structure 280 having the first conductivity type embedded in the drift layer 630, wherein the recessed epitaxial structure 280 is disposed in a cell region 140a; a vertical diffusion region 640 having the first conductivity type in the drift layer 630, the vertical diffusion region 640 surrounding the recessed epitaxial structure 280; a source conductor 580 disposed on the recessed epitaxial structure 280; and a trench isolation 600 disposed within a junction termination region 140b surrounding the cell region 140a, wherein the trench isolation 600 comprises a trench 460, an insulating layer 650 on an interior surface of the trench 460, and a conductive layer 550 filled into the trench 460, and wherein the source conductor 580 is electrically connected to the conductive layer 550.

To summarize, the present invention provides an insulating layer located within the junction termination region 140b in the trench isolation 600, wherein the insulation layer is thick enough to increase the voltage sustaining ability of the device to therefore improve the reliability of the device.

Those skilled in the art will readily observe that numerous modifications and alterations of the device and method may be made while retaining the teachings of the invention.

What is claimed is:

1. A semiconductor power device, comprising:
   a substrate having a first conductivity type;
   a first semiconductor layer having a second conductivity type on the substrate;
   a second semiconductor layer having the second conductivity type on the first semiconductor layer;
   a third semiconductor layer having the second conductivity type on the second semiconductor layer;

at least a recessed epitaxial structure having the first conductivity type embedded in the third semiconductor layer, wherein the recessed epitaxial structure is disposed in a cell region;

a first vertical diffusion region having the first conductivity type in the third semiconductor layer, the first vertical diffusion region surrounding the recessed epitaxial structure;

a source conductor disposed on the recessed epitaxial structure; and a trench isolation disposed within a junction termination region surrounding the cell region, wherein the trench isolation comprises a trench, a first insulating layer on an interior surface of the trench, and a conductive layer filled into the trench, and wherein the source conductor is electrically connected to the conductive layer.

2. The semiconductor power device according to claim 1 wherein the trench isolation further comprises a second vertical diffusion region having the first conductivity type in the first semiconductor layer and extending to the substrate, wherein the second vertical diffusion region is in direct contact with the first insulating layer.

3. The semiconductor power device according to claim 1, further comprising: a first ion well having the first conductivity type in the third semiconductor layer, and wherein the first ion well is located at an upper portion of the recessed epitaxial structure.

4. The semiconductor power device according to claim 1 wherein the trench extends downwardly to the substrate.

5. The semiconductor power device according to claim 1 wherein the vertical junction is formed between the first vertical diffusion region and the third semiconductor layer.

6. The semiconductor power device according to claim 1 wherein the recessed epitaxial structure is a pillar-shaped structure.

7. The semiconductor power device according to claim 1 wherein the recessed epitaxial structure is a stripe-shaped structure.

8. The semiconductor power device according to claim 1 wherein the first insulating layer covers and electrically isolates the conductive layer.

9. The semiconductor power device according to claim 1, further comprising: a coupling gate on the third semiconductor layer.

10. The semiconductor power device according to claim 1, further comprising:
a drain conductor extending downwardly to the second semiconductor layer and electrically connected to the second semiconductor layer.

11. The semiconductor power device according to claim 1 wherein the first semiconductor layer, the second semiconductor layer and the third semiconductor layer are all epitaxial silicon layers, and wherein the second semiconductor layer has a doping concentration greater than that of either the first semiconductor layer or the third semiconductor layer.

12. The semiconductor power device according to claim 1 wherein the third semiconductor layer acts as a drift layer.

13. The semiconductor power device according to claim 1 wherein the first conductivity type is P type and the second conductivity type is N type.

14. The semiconductor power device according to claim 3, further comprising: a
first doped region having the second conductivity type in the first ion well, and wherein the first doped region is located at the upper portion of the recessed epitaxial structure.

15. The semiconductor power device according to claim 10, further comprising:
a second insulating layer electrically isolating the drain conductor from the third semiconductor layer.

16. The semiconductor power device according to claim 10, further comprising:
a field oxide layer on the third semiconductor layer, wherein the field oxide layer is in proximity to the drain conductor.

17. The semiconductor power device according to claim 14, further comprising: a
second doped region having the first conductivity type located between the source conductor and the recessed epitaxial structure.

18. The semiconductor power device according to claim 15, further comprising:
a third vertical diffusion region having the first conductivity type in the third semiconductor layer, wherein the third vertical diffusion region is in direct contact with the second insulating layer.

19. A semiconductor power device, comprising:
a substrate having a first conductivity type;
a dielectric layer on the substrate;
a semiconductor layer having a second conductivity type on the dielectric layer;
a drift layer having the second conductivity type on the semiconductor layer;
at least a recessed epitaxial structure having the first conductivity type embedded in the drift layer, wherein the recessed epitaxial structure is disposed in a cell region;
a vertical diffusion region having the first conductivity type in the drift layer, the vertical diffusion region surrounding the recessed epitaxial structure;
a source conductor disposed on the recessed epitaxial structure; and
a trench isolation disposed within a junction termination region surrounding the cell region, wherein the trench isolation comprises a trench, an insulating layer on an interior surface of the trench, and a conductive layer filled into the trench, and wherein the source conductor is electrically connected to the conductive layer.

20. The semiconductor power device according to claim 19 wherein the source conductor is electrically connected to the recessed epitaxial structure.

* * * * *